United States Patent
Chen et al.

(10) Patent No.: US 10,948,834 B2
(45) Date of Patent: *Mar. 16, 2021

(54) DYNAMIC IMAGING SYSTEM

(71) Applicant: Applied Materials, Inc., Santa Clara, CA (US)

(72) Inventors: Ching-Chang Chen, Tainan (TW); Chien-Hua Lai, Taichung (TW); Wei-Chung Chen, Kaohsiung (TW); Shih-Hao Kuo, Hsinchu (TW); Hsiu-Jen Wang, Taichung (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/917,278

(22) Filed: Jun. 30, 2020

(65) Prior Publication Data

US 2020/0333711 A1  Oct. 22, 2020

Related U.S. Application Data (63) Continuation of application No. 16/031,675, filed on Jul. 10, 2018, now Pat. No. 10,719,018.

(51) Int. Cl.
  *G03B 27/58*  (2006.01)
  *G03F 7/20*  (2006.01)

(52) U.S. Cl.
  CPC ................. *G03F 7/7065* (2013.01)

(58) Field of Classification Search
  CPC ............. G03F 7/7065; G03F 7/70775; G03F 7/70275; G03F 9/7015
  See application file for complete search history.

(56) References Cited

U.S. PATENT DOCUMENTS

| | | | |
|---|---|---|---|
| 6,883,158 B1 | 4/2005 | Sandstrom et al. | |
| 9,927,723 B2 | 3/2018 | Johnston et al. | |
| 10,719,018 B2 * | 7/2020 | Chen | G03F 7/7065 |
| 2005/0248659 A1 | 11/2005 | Kasumi et al. | |
| 2007/0026325 A1 | 2/2007 | Maria Derksen et al. | |
| 2007/0253001 A1 | 11/2007 | Watanabe et al. | |
| 2008/0273184 A1 | 11/2008 | Morimoto et al. | |
| 2009/0115981 A1 | 5/2009 | Mushano | |
| 2011/0213479 A1 | 9/2011 | Wahlsten et al. | |
| 2013/0242277 A1 | 9/2013 | Mulckhuyse et al. | |

(Continued)

OTHER PUBLICATIONS

PCT Notification of Transmittal of the International Search Report and the Written Opinion of the International Searching Authority for International Application No. PCT/2019/033839; dated Sep. 4, 2019; 17 total pages.

*Primary Examiner* — Peter B Kim
(74) *Attorney, Agent, or Firm* — Patterson + Sheridan, LLP (57) ABSTRACT

Embodiments described provide dynamic imaging systems that compensates for pattern defects resulting from distortion caused by warpage of the substrate. The methods and apparatus described are useful to create compensated exposure patterns. The dynamic imaging system includes an inspection system configured to provide 3D profile measurements and die shift measurements of the first substrate to the interface configured to provide compensated pattern data to the digital lithography system configured to receive the compensated pattern data from the interface and expose the photoresist with a compensated pattern.

17 Claims, 9 Drawing Sheets

(56) References Cited

U.S. PATENT DOCUMENTS

| | | |
|---|---|---|
| 2015/0201499 A1 | 7/2015 | Shinar et al. |
| 2016/0141213 A1 | 5/2016 | Bishop et al. |
| 2016/0282728 A1 | 9/2016 | Johnston et al. |
| 2016/0282849 A1 | 9/2016 | Hollerbach et al. |
| 2017/0083183 A1 | 3/2017 | Malvin |

\* cited by examiner

DYNAMIC IMAGING SYSTEM

CROSS-REFERENCE TO RELATED APPLICATIONS

This application is a continuation of U.S. patent application Ser. No. 16/031,675, filed Jul. 10, 2018, the entirety of which is herein incorporated by reference.

BACKGROUND

Field

Embodiments of the present disclosure generally relate to photolithography systems. More particularly, embodiments of the present disclosure relate to digital lithography systems that compensate for pattern defects.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixels, sandwiched between two plates. When power from a power supply is applied across or through the liquid crystal material, an amount of light passing through the liquid crystal material is controlled, i.e., selectively modulated, at the pixel locations enabling images to be generated on the display.

Digital lithography techniques have been employed to create electrical features used to supply electricity to selectively modulate the liquid crystal material at the pixel locations. According to these techniques, a thin film layer, and then a light-sensitive photoresist, is applied to at least one surface of the substrate. Then, a pattern generator exposes selected areas of the light-sensitive photoresist with light to cause chemical changes to the photoresist in the selective areas to prepare selective areas of the photoresist for subsequent material removal processes to create the electrical features.

One issue encountered in any lithography process involving large area display panel substrates and small area semiconductor substrates exposed to back-end processing is substrate warpage. If the substrate is warped, i.e., the substrate has a curvature in two or three dimensions, the resultant location of the exposure of the photoresist will be shifted. Furthermore, if a warped substrate is used to carry a plurality of chip-die, each die on the warped substrate has local x-shift and y-shift, commonly known as die-shift. The resultant location of the exposure of the photoresist will be distorted and shift, and the pattern will become shifted and disconnected. This results in the eventual production of a lower quality, or even a non-functional, display panel, and advance package product.

Accordingly, there is a need for a dynamic imaging system that compensates for pattern defects resulting from distortion caused by warpage and die-shift of the substrate.

SUMMARY

In one embodiment, a system is provided. The system includes a slab, a moveable first stage disposable over the slab, a first encoder coupled to the first stage, an inspection system supported by an inspection system support coupled to the slab, and a digital lithography support coupled to the slab. The first stage is configured to support a first substrate having a photoresist disposed thereon. The first encoder is configured to provide a position of the first substrate to an interface configured to provide exposure pattern data to a digital lithography system. The inspection system has an opening to allow the first stage to pass thereunder. The inspection system is configured to provide three-dimensional (3D) profile measurements and die-shift measurements of the first substrate to the interface. The interface configured to provide compensated pattern data to the digital lithography system. The digital lithography system has an opening to allow the first stage to pass thereunder. The digital lithography system is configured to receive the compensated pattern data from the interface and expose the photoresist with a compensated pattern.

In another embodiment, a system is provided. The system includes a slab, a moveable first stage disposable over the slab, a first encoder coupled to the first stage, an inspection system supported by an inspection system support coupled to the slab, and a digital lithography support coupled to the slab. The first stage is configured to support a first substrate having a photoresist disposed thereon. The first encoder is configured to provide a position of the first substrate to an interface configured to provide exposure pattern data to a digital lithography system. The inspection system has an opening to allow the first stage to pass thereunder. The inspection system includes an inspection processing unit that includes a warpage inspection tool having one or more warpage inspection modules configured to measure 3D profiles of areas of the first substrate a warpage inspection tool having one or more warpage inspection modules configured to measure 3D profiles of areas of the first substrate and a die-shift inspection tool with one or more die-shift inspection modules configured to measure a die-shift of at least one die of a plurality of dies without exposing the photoresist disposed on the areas of the first substrate and the plurality of dies, the inspection is configured to provide the 3D profiles of the areas and the die-shift of at least one die to the interface. The interface configured to modify the exposure pattern data into compensated pattern data and provide the compensated pattern data to the digital lithography system. The digital lithography system has an opening to allow the first stage to pass thereunder. The digital lithography system the digital lithography system includes a digital lithography processing unit having one or more digital lithography modules configured to expose the photoresist disposed on the areas of the first substrate in a digital lithography process with a compensated pattern.

In yet another embodiment, a system is provided. The system includes a slab, a moveable first stage disposable over the slab, a first encoder coupled to the first stage, an inspection system supported by an inspection system support coupled to the slab, and a digital lithography support coupled to the slab. The first stage is configured to support a first substrate having a photoresist disposed thereon. The first encoder is configured to provide a position of the first substrate to an interface configured to provide exposure pattern data to a digital lithography system. The inspection system has an opening to allow the first stage to pass thereunder. The inspection system includes an inspection processing unit that includes a warpage inspection tool having one or more warpage inspection modules configured to measure 3D profiles of areas of the first substrate a warpage inspection tool having one or more laser triangulation modules configured to measure 3D profiles of areas of the first substrate and a die-shift inspection tool with one or more automated optical inspection (AOI) modules configured to measure a die-shift of at least one die of a plurality of dies without exposing the photoresist disposed on the areas of the first substrate and the plurality of dies, and the inspection unit is configured to provide the 3D profiles of the areas and the die-shift of at least one die to the interface. The interface is configured to modify the exposure pattern data into compensated pattern data and provide the compensated pattern data to the digital lithography system. The one or more laser triangulation modules include a laser source, a transmitter lens configured to allow light to be delivered to the areas of the first substrate without patterning the photoresist disposed on the areas of the first substrate, a light receiving lens, and a light receiving element configured to provide a z-axis position of a plurality points of on the areas of the first substrate. The digital lithography system has an opening to allow the first stage to pass thereunder. The digital lithography system the digital lithography system includes a digital lithography processing unit having one or more digital lithography modules configured to expose the photoresist disposed on the areas of the first substrate in a digital lithography process with a compensated pattern.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Embodiments described herein provide dynamic imaging systems that compensates for pattern defects resulting from distortion caused by warpage and die-shift. Herein, the methods and apparatus described are useful to create compensated exposure patterns in photoresists, or other written to film layers, wherein later changes in the dimensions of the substrate result in the proper positioning of the exposure pattern, and any resultant etched film layer. For example, where a substrate is warped and at least on die is shifted during the lithography process, the system and methods herein allow a digital exposure pattern to be written to a photoresist on a substrate compensating for warpage and die-shift.

Figure 1A:
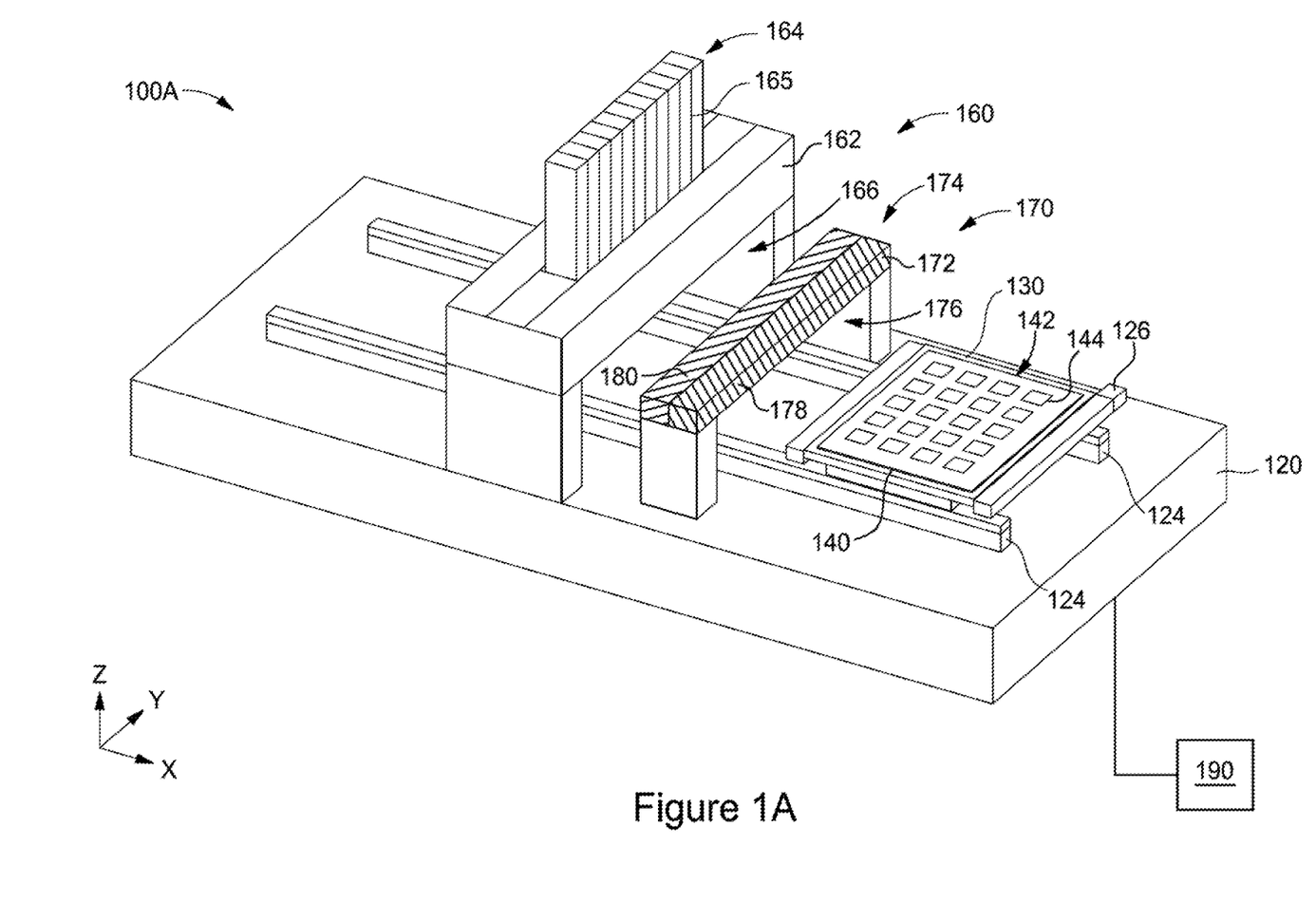
FIG. 1A is a perspective schematic view of a dynamic imaging system according to an embodiment.

FIG. 1A is a perspective schematic view of a dynamic imaging system 100A according to embodiments disclosed herein. The dynamic imaging system 100A includes a stage 130, a digital lithography system 160, and an inspection system 170. In one embodiment, the stage 130 is supported by a pair of tracks 124 disposed on a slab 120. A substrate 140 is supported by the stage 130. The substrate 140 comprises any suitable material, for example, glass, which is used as part of a flat panel display. In other embodiments, the substrate 140 is made of other materials capable of being used as a part of the flat panel display. The substrate 140 has a film layer to be patterned formed thereon, such as by pattern etching thereof, and a photoresist layer formed on the film layer to be patterned, which is sensitive to electromagnetic radiation, for example UV or deep UV "light".

A positive photoresist includes portions of the photoresist, which, when exposed to radiation, are respectively soluble to a photoresist developer applied to the photoresist after the pattern is written into the photoresist using the electromagnetic radiation. A negative photoresist includes portions of the photoresist, which, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

Herein, a simplified digital lithography apparatus is schematically shown, wherein the digital lithography system 160 is sized to be capable of exposing the entire width of the photoresist layer on the substrate 140 in the Y direction, i.e., the substrate 140 is small compared to those of an actual flat panel display substrate. However, in an actual digital lithography apparatus, the digital lithography system 160 will be significantly smaller, in the Y direction, than the width of the substrate 140 in the Y direction, and the substrate 140 will be sequentially moved in the −X direction under the digital lithography system 160, moved or stepped in the +Y direction, scanned backed in the +X direction under the digital lithography system 160. This X direction scanning and Y direction stepping operation will continue until the entire substrate area has passed under the writable area of the digital lithography system 160. In the dynamic imaging system 100A of FIG. 1A, dynamic imaging system 100A includes the pair of tracks 124 disposed on the stage 130, and the stage 130 moves along the pair of tracks 124 in the −X-direction as indicated by the coordinate system shown in FIG. 1A. As shown, each track of the pair of tracks 124 is linear. An encoder 126 is coupled to the stage 130. The encoder 126 is configured to provide information regarding the location of the substrate 140 with respect to the inspection system 170 and the digital lithography system 160, more particularly to the writable location of the beams at the upper surface of the substrate 140 as it passes under the inspection system 170 and the writing head of the digital lithography system 160 to an distributor 306 (shown in FIG. 3) of the inspection system 170.

In an embodiment, the inspection system 170 includes an inspection system support 172 and an inspection processing unit 174. The inspection processing unit 174 includes a warpage inspection tool 178 and die-shift inspection tool 180. The inspection system support 172 straddles the pair of tracks 124 and is disposed on the slab 120 on either side of the pair of tracks 124 and includes an opening 176 therethrough for the pair of tracks 124, and thus the stage 130, to pass under the inspection system 170. The inspection processing unit 174 is supported by the inspection system support 172. The inspection system 170 is integrated with the digital lithography system 160 to allow the beam output of the digital lithography system to positionally compensate for substrate warpage and die-shift. The warpage inspection tool 178 includes one or more warpage inspection modules 302 and die-shift inspection tool 180 includes one or more die-shift inspection modules 304. The inspection processing unit 174 is configured to provide three-dimensional (3D) profile measurements and die-shift measurements of specific areas of the substrate 140 to the interface 190.

The inspection processing unit 174 measures the 3D profile and die-shift of specific areas of the substrate 140 having a plurality of dies 142 without chemically changing the photoresist in the specific areas being evaluated thereby such that the photoresist in the specific areas is not exposed until the specific areas are exposed to the beams of the digital lithography system 160 based on compensated pattern data received from the interface 190. More specifically, as the substrate 140 passes under the inspection system 170, the warpage of the substrate 140 and die-shift of at least on die 144 of the plurality of dies 142 is evaluated continuously, and the three-dimensional (3D) profile measurements and die-shift measurements are fed to the interface 190, which changes the writing pattern supplied to the digital lithography system if required based on the flatness, or non-flatness, of the substrate 140. For example, the 3D profile measurements include the difference of z-axis positions between the expected distance of the substrate 140 from the inspection processing unit 174 and the actual distance of the substrate 140 from the inspection processing unit 174 across discrete lengths of the substrate 140 in the X direction and across the full width of the substrate in the Y direction. For example, the die-shift measurements include the differences in x-axis and y-axis positions between expected coordinates of at least one die 144 based on a global die-shift grid and actual coordinates of the die 144. In one embodiment, the coordinates may be the centroid of the die 144. In another embodiment, the coordinates may be at least one corner of the die 144. The 3D profile measurements and die-shift measurements are continuously transmitted to the interface 190 as the substrate 140 passes under the inspection processing unit 174. Using this information, the interface 190 modifies the exposure pattern data sent to the digital lithography processing unit 164, i.e., to the individual writing heads therein, to compensate for the warpage and die-shift. Where the leading edge of the substrate 140 reaches the beam writing area of the digital lithography processing unit 164 while the trailing edge of the substrate 140 has not reached the region below the inspection processing unit 174, the exposure pattern data which is sent to the digital lithography processing unit 164 frees up memory space for additional data being sent to the interface 190, and thus the size of the interface 190 memory can be reduced."

Herein, the digital lithography system 160 includes a digital lithography support 162 and a digital lithography processing unit 164. The digital lithography support 162 straddles the pair of tracks 124 and is disposed on the slab 120, and thereby includes an opening 166 for the pair of tracks 124 and the stage 130 to pass under the digital lithography processing unit 164. The digital lithography processing unit 164 is supported by the digital lithography support 162. The digital lithography processing unit 164 is a pattern generator configured to receive the compensated pattern data from the interface 190 and expose a photoresist in a digital lithography process with a compensated pattern using the compensated pattern data. The inspection processing unit 174 includes one or more digital lithography modules 102. In one embodiment, the digital lithography processing unit 164 contains as many as 80 digital lithography modules 102. Each digital lithography module 102 is disposed in a case 165.

Figure 1B:
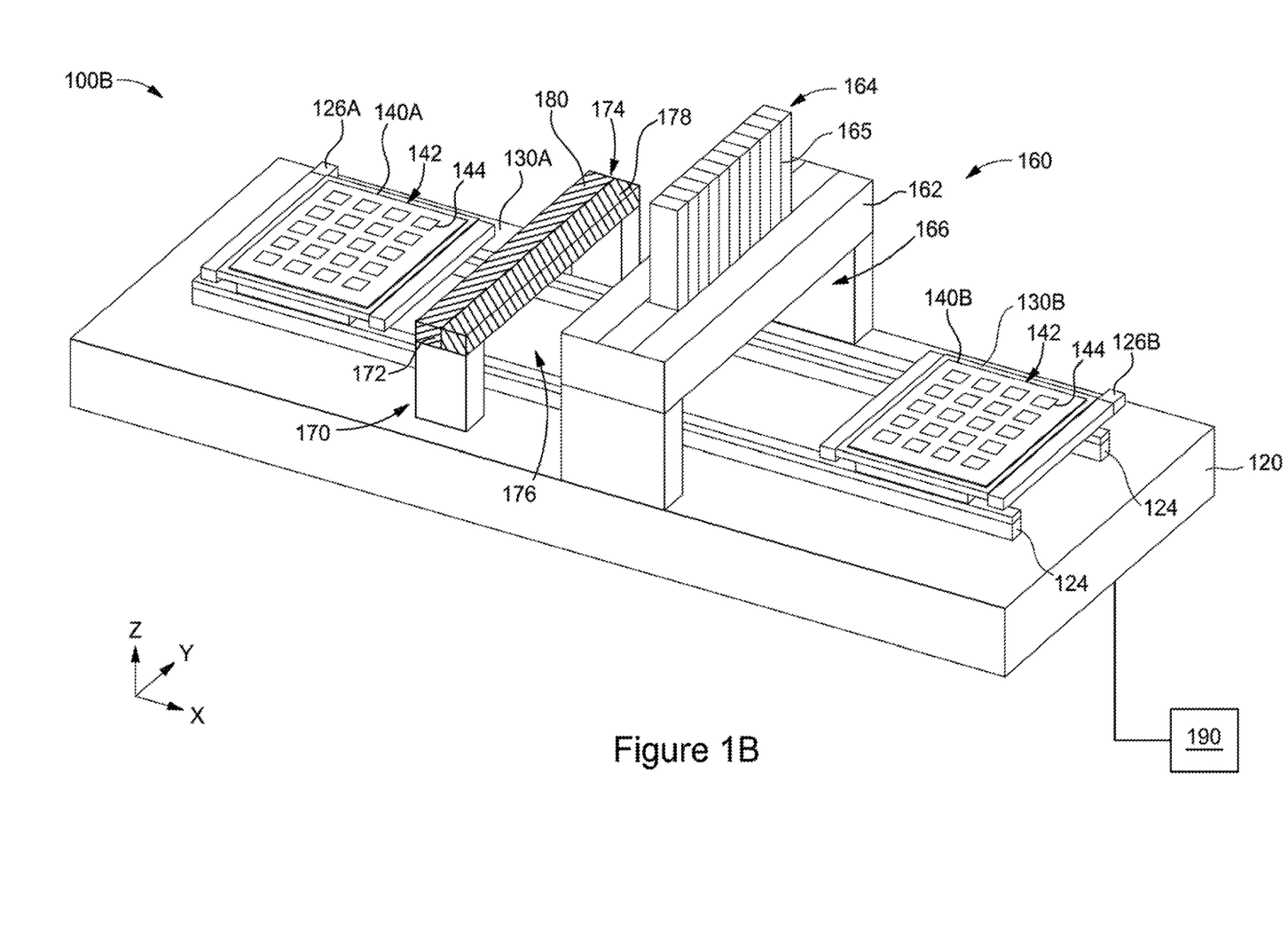
FIG. 1B is a perspective schematic view of a dynamic imaging system according to an embodiment.

FIG. 1B is a perspective schematic view of a dynamic imaging system 100B according to embodiments disclosed herein. The dynamic imaging system 100B is similar to the dynamic imaging system 100A; however, the dynamic imaging system 100B includes two stages 130A and 130B, wherein compensated pattern data is sent from the interface 190 to the digital lithography processing unit 164 based on the evaluation of the substrate 140A and 140B as set forth above. Here, each of the two stages 130A and 130B is capable of independent operation such that the inspection system 170 provides the 3D profile measurements of the substrate 140A and the substrate 140B and die-shift measurements at least one die 144 of the plurality of dies 142 of the substrate 140A and the substrate 140B to the interface 190 and the digital lithography system 160 exposes specific areas of the substrate 140A and the substrate 140B using compensated pattern data in a digital lithography process. In one example, the inspection system 170 measures the 3D profile of the substrate 140A on the stage 130A and the die-shift at least one die 144 and provides the 3D profile measurements and die-shift measurements to the interface 190 as described above, and the digital lithography system 160, having received the compensated pattern data for substrate 140B from the interface 190, exposes the substrate 140B on the stage 130B using the compensated pattern data. The first and second encoders 126A and 126B are respectively co-located with the stages 130A and 130B and provide location information concerning the location of the substrates 140A and 140B with respect to the inspection system 170 and the digital lithography processing unit 164 to the interface 190 to coordinate the evaluated substrate data with positions on the substrate 140.

In contrast to the embodiment of FIG. 1A, here, as a substrate 140A is being unloaded from stage 130A, and a new substrate 140A subsequently loaded thereon, stage 130B is moved to a location between the inspection system 170 and the substrate loading/unloading position of stage 130A, and then moved in the X direction to sequentially evaluate the distance between the substrate 140B and the inspection processing unit as described above with respect to the embodiment of FIG. 1A, this data is transmitted to the processer of the interface 190, and compensated pattern data is transmitted from the interface to the digital lithography processing unit 164 to write a compensated pattern into the photoresist on substrate 140B.

Figure 2A:
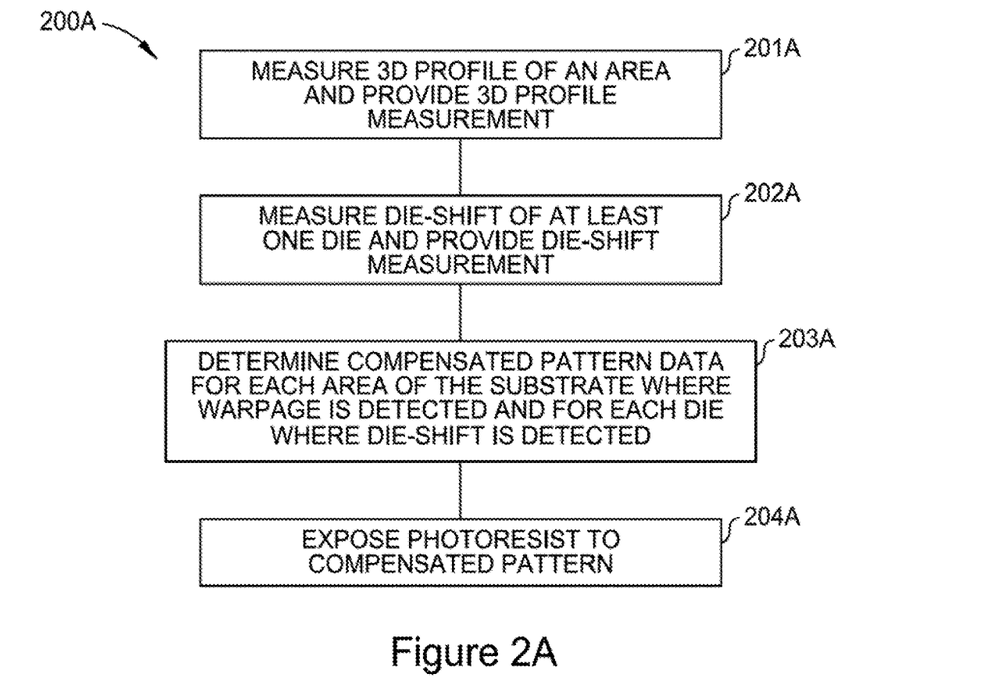
FIG. 2A is a flow chart of a method of using the dynamic imaging system according to an embodiment.
Figure 2B:
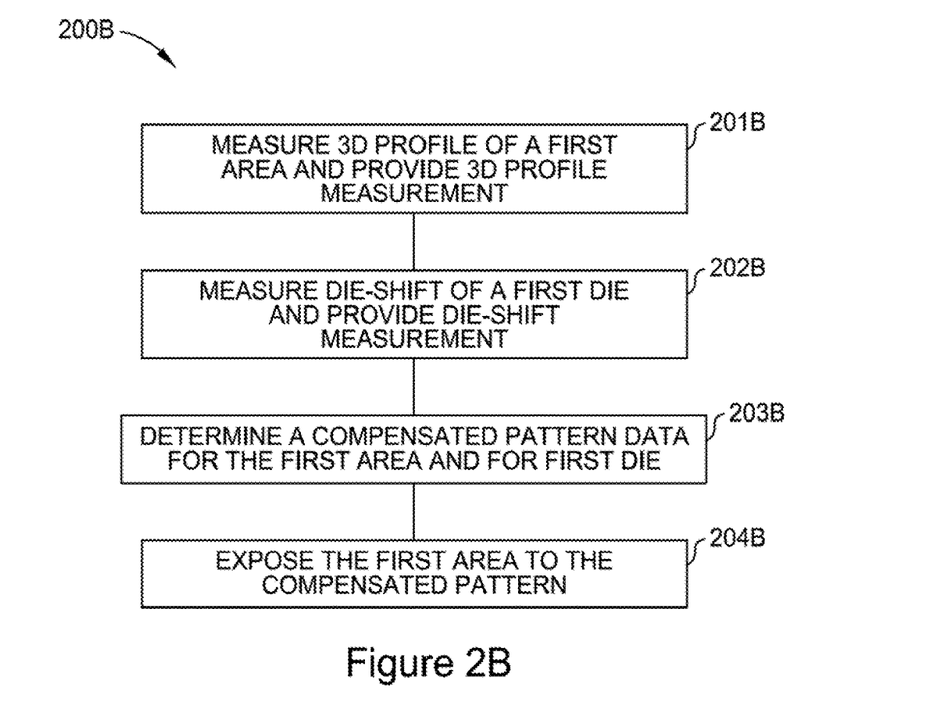
FIG. 2B is a flow chart of a method of using the dynamic imaging system according to an embodiment.

FIG. 2A and FIG. 2B are flow charts of methods of using the dynamic imaging system 100A and the dynamic imaging system 100B according to embodiments disclosed herein. The interface 190 facilitates the control and automation of an in-line correction process 200A (shown in FIG. 2A) and a real-time correction process 200B (shown in FIG. 2B). The interface 190 is coupled to or in communication with the inspection system 170, the digital lithography system 160, the stages 130, and the encoders 126. The inspection system 170 provides 3D profile measurements of specific areas of the substrate 140, for example stripes of the substrate 140 in the Y direction, sequentially as the substrate 140 moves thereunder in an X direction to the interface 190. The inspection system 170 further provides die-shift measurements of at least one die 144 of a plurality of dies 142 sequentially as the substrate 140 moves thereunder in an X direction to the interface 190. The digital lithography system 160 receives the compensated pattern data from the interface 190 and provides information to the interface 190 regarding the digital lithography process. The encoder 126 provides location information regarding the position of the substrate (s) 140 relative to the inspection system and the beam writing area of the digital lithography processing unit 164 to the interface 190, so that the interface 190, and the digital lithography processing unit 164, can coordinate the location of the compensated pattern data to the correct location to be written on the photoresist layer on the substrate 140. The distributor 306 (shown in FIG. 3) controls the sequence of providing 3D profile measurements and die-shift measurements At operation 201A of the in-line correction process 200A, the 3D profile of an area of the substrate 140, for example a stripe in the Y direction along a discrete length of the substrate in the X direction is measured and the 3D profile measurement is provided to the interface 190. The warpage inspection tool 178 of the inspection processing unit 174 performs this measuring of the 3D profile of an area of the substrate 140 as described above and provides the 3D profile measurement to the interface 190 without chemically changing the photoresist in the area such that the area is not pattered, such as by using an interrogation radiation that does not expose the photoresist. Operation 201A is repeated for successive areas of the substrate until 3D profile measurements along the entire length of the substrate 140 in the X direction are taken.

At operation 202A of the in-line correction process 200A, the die-shift of at least one die 144 of the substrate 140 is measured and the die-shift measurement is provided to the interface 190. The die-shift inspection tool 180 of the inspection processing unit 174 performs this measuring of the die-shift of at least one die 144 as described above and provides the die-shift measurement to the interface 190 without chemically changing the photoresist such that the photoresist is not pattered, such as by using an interrogation radiation that does not expose the photoresist. Operation 202A is repeated for at least one die 144 until die-shift measurements of the plurality of dies 142, also known as a global die-shift measurement, are taken. In one embodiment, the distributor 306 controls the order of operation 201A and operation 202A such that operation 201A occurs before operation 202A.

At operation 203A, the interface 190 determines the compensated pattern data for each area of the substrate 140 where warpage is found and for each die 144 where die-shift is found, based on the actual warpage and die-shift, and overwrites the exposure pattern data file where warpage and die-shift were found. The interface 190 creates a compensated data file and transmits to the compensated data for the digital lithography processing unit 164 to write the compensated pattern into the photoresist of the substrate 140. At operation 204A, the substrate 140 is exposed using the compensated pattern data to form the compensated pattern in the photoresist on the substrate 140.

At operation 201B of the real-time correction process 200B, the 3D profile of a first area of the substrate 140 is measured and the 3D profile measurement is provided to the interface 190. The warpage inspection tool 178 of the inspection processing unit 174 measures the 3D profile of an evaluated area of the substrate 140 and provides the 3D profile measurement to the interface 190 without chemically changing the photoresist in the first area such that the first area is not pattered. At operation 202B of the real-time correction process 200B, the die-shift of a first die 144 is measured and the die-shift measurement is provided to the interface 190. The die-shift inspection tool 180 of the inspection processing unit 174 measures the die-shift of the first die 144 and provides the die-shift measurement to the interface 190 without chemically changing the photoresist such that the photoresist is not pattered. In one embodiment, the distributor 306 controls the order of operation 201B and operation 202B such that operation 201B occurs before operation 202B.

At operation 203B, the interface 190 determines the compensated pattern data for each portion of the first area of the substrate 140 where warpage is found and for the first die 144 where die-shift is found, based on the actual warpage and die-shift, and overwrites the exposure pattern data file where warpage and die-shift were found. The interface 190 creates a compensated data file portion for that portion of the substrate 140 and first die 144 to write the compensated pattern into the photoresist in that portion of the substrate 140 and first die 144 before additional portions of the surface of the substrate 140 and additional dies have been measured by the inspection processing unit 174. A pattern generator of the digital lithography processing unit 164 of the digital lithography system 160 receives the compensated pattern data from the interface 190 to allow the digital lithography system 160 to expose the first area of the substrate 140 to form the compensated pattern in the photoresist on the substrate 140.

At operation 204B, the first area of the substrate 140 is exposed using the compensated pattern data to form the compensated pattern in the photoresist on the substrate 140. In one embodiment, the first die 144 is in the first area. At operation 204B, the completion of the digital lithography process in the first area of the substrate 140 and positon of the substrate 140 are determined. The digital lithography system 160 alerts the interface 190 that the digital lithography process is complete for the first area of the substrate and the encoder 126 provides the current position of the substrate 140. If a portion of the substrate 140 remains in the inspection system 170 as the photoresist on the first portion of the substrate 140 is being exposed, that portion of the substrate is measured as the photoresist on the first portion of the substrate 140 is being exposed. The real-time correction process 200B is repeated for successive areas and successive dies, such as the entire surface of the substrate 140.

Figure 3:
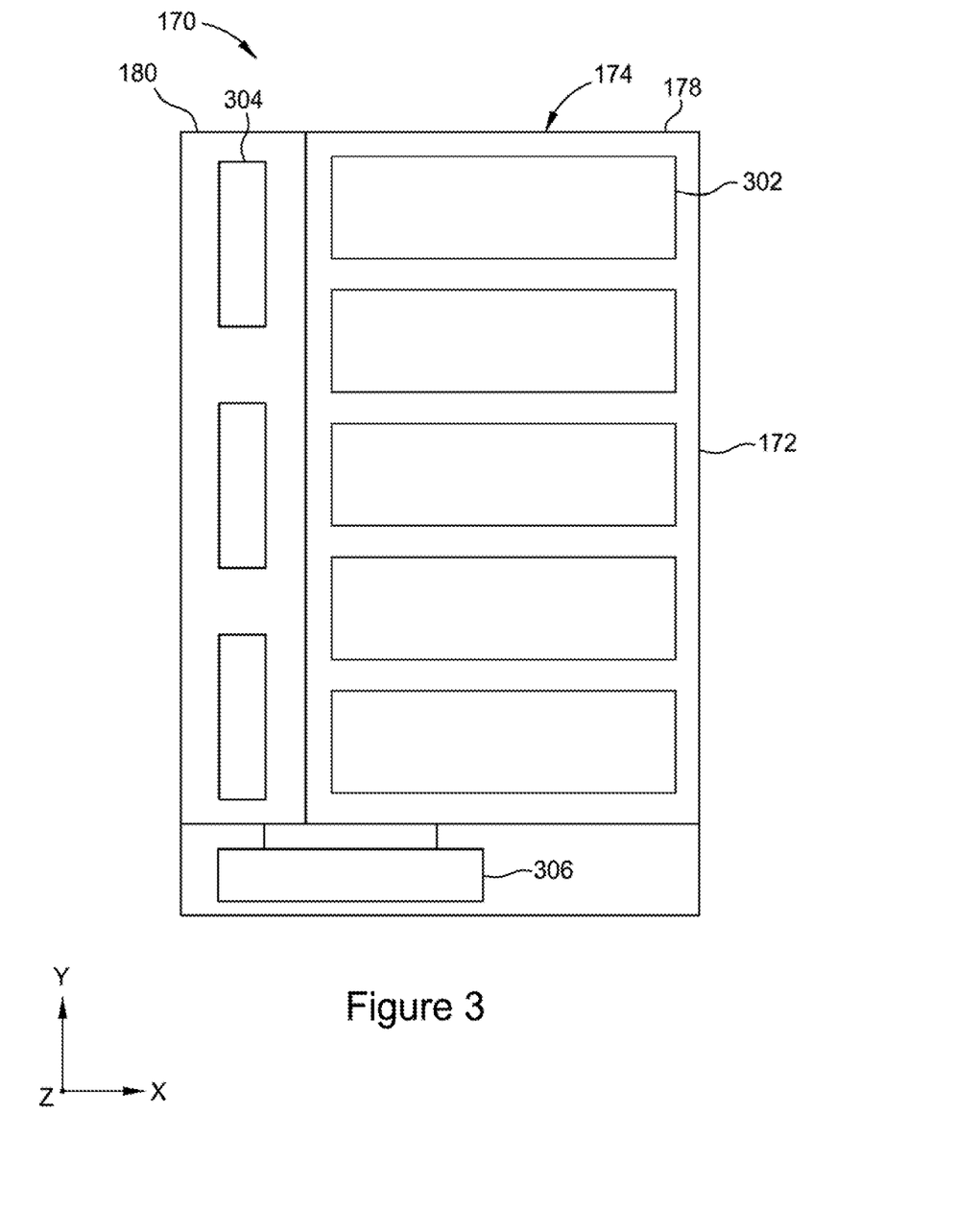
FIG. 3 is an enlarged schematic top view of an exemplary inspection system according to an embodiment.

FIG. 3 is an enlarged schematic top view of an exemplary inspection system 170. The inspection system 170 includes the inspection system support 172 and the inspection processing unit 174. The inspection processing unit 174 includes a warpage inspection tool 178, die-shift inspection tool 180, and distributor 306. The warpage inspection tool 178 has one or more warpage inspection modules 302 configured to measure the 3D profile of specific areas of the substrate 140 (shown in FIG. 1A). The inspection processing unit 174 includes a warpage inspection tool 178 and die-shift inspection tool 180. The die-shift inspection tool 180 has one or more die-shift inspection modules 304 configured to measure the die-shift of at least one die 144 (shown in FIG. 1A). The substrate 140 is measured, i.e., evaluated for warpage, as it travels below the warpage inspection modules 302, without the photoresist thereon being chemically changed. The substrate 140 is measured, i.e., evaluated for warpage, as it travels below the one or more warpage inspection modules 302, without the photoresist thereon being chemically changed. The substrate 140 is measured, i.e., evaluated for die-shift, as it travels below the one or more die-shift inspection modules 304, without the photoresist thereon being chemically changed.

Figure 4A:
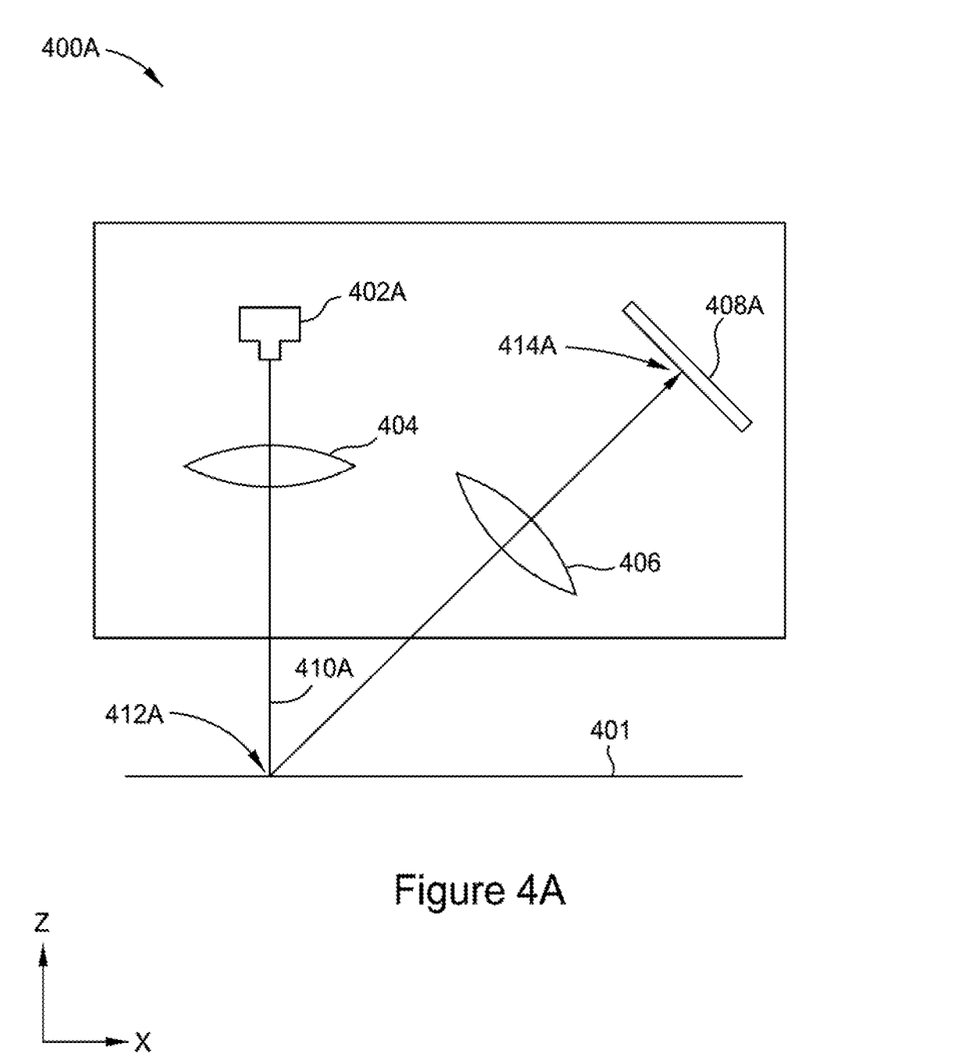
FIG. 4A is an enlarged schematic cross-sectional view of a laser triangulation module according to an embodiment.
Figure 4B:
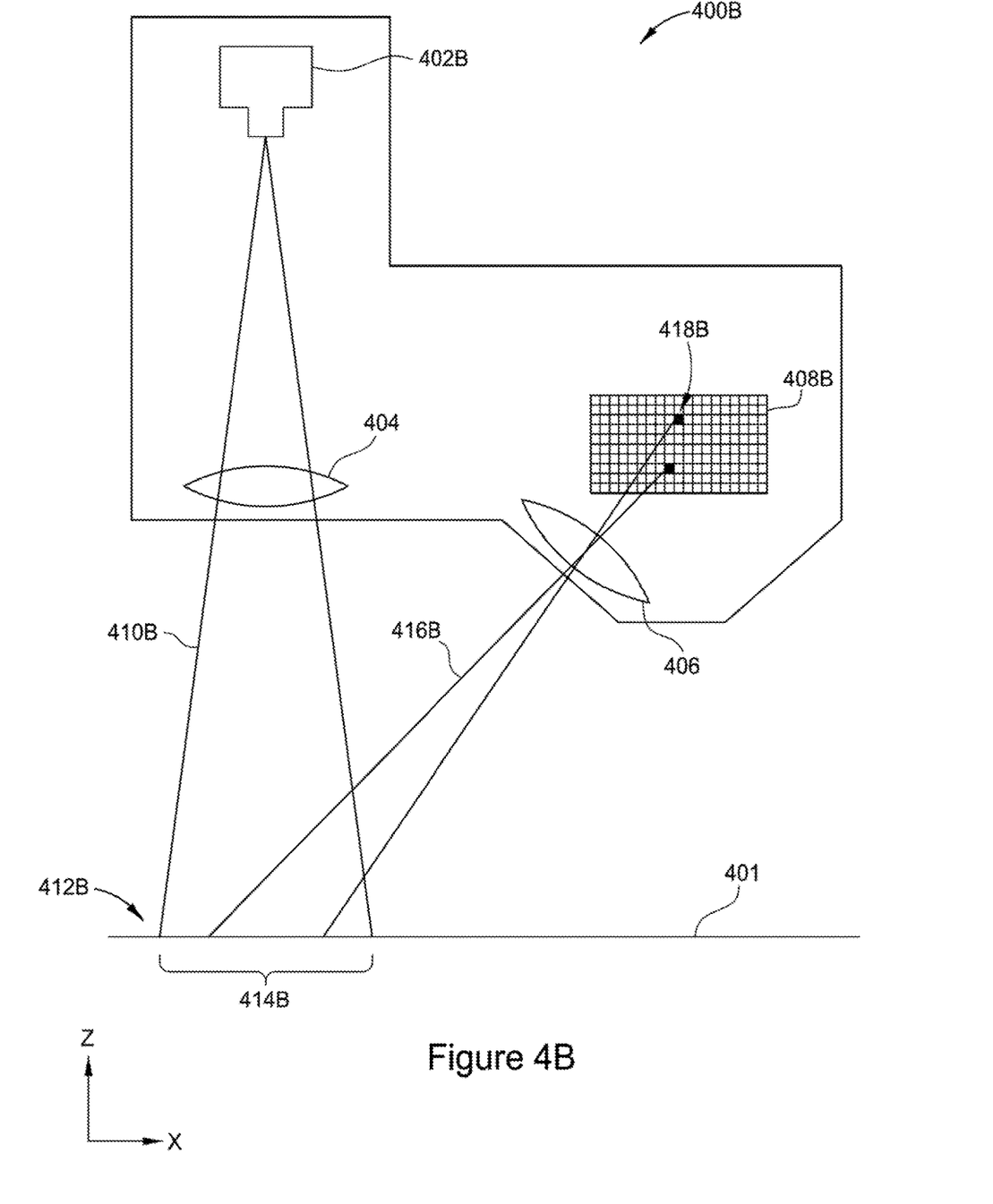
FIG. 4B is an enlarged schematic cross-sectional view of a laser triangulation module according to an embodiment.

In one embodiment, the one or more warpage inspection modules 302 are laser triangulation modules (shown in FIG. 4A and FIG. 4B). In another embodiment, the one or more warpage inspection modules 302 are color confocal modules (shown in FIG. 5). In yet another embodiment, the one or more die-shift inspection modules 304 are automated optical inspection (AOI) modules. One example, of an AOI module is an area scan camera having a grabber card. Here, the substrate movement is to the X direction or −X direction passing under the one or more warpage inspection modules 302 and the one or more die-shift inspection modules 304. Although the one or more warpage inspection modules 302 are physically spaced from one another and the one or more die-shift inspection modules 304 are physically spaced from one another, the area of the substrate 140 over which each module can evaluate the substrate 140 passing thereunder is greater than the projected area of the module on the substrate in the X and Y directions.

FIG. 4A is an enlarged schematic cross-sectional view of a laser triangulation module 400A. The laser triangulation module 400A includes a laser source 402A, a transmitter lens 404, a light receiving lens 406, and a light receiving element 408A. In one embodiment, the laser source 402A is configured to deliver a beam of light 410A to a point 412A on a specific area 401 of the substrate 140 (shown in FIG. 1A), which, as the substrate 140 is moving, can result in an illuminate devaluation line along the substrate 140 if the laser source 402A is not strobed. The laser source 402A is selected to output a wavelength which does not chemically alter the photoresist on the substrate 140. The transmitter lens 404 causes the beam of light 410A to be delivered to the point 412A on the specific area. The beam of light 410A is reflected by the photoresist, the underlying substrate 140 surface, or both at point 412A on the specific area 401 through the light receiving lens 406 to a point 414A on the light receiving element 408A. The light receiving element 408A is positioned, and calibrated, such that the point 414A on the light receiving element 408A where the reflected laser light is received corresponds to a z-axis position of the point 412A of the specific area 401, i.e., the height relative to baseline plane, as well as the distance in the Z direction from the light receiving element 408A. The laser beam is delivered to a plurality of points on the specific area 401, for example along a line extending in the opposite X direction from which the substrate 140 is moving, to generate a 3D profile measurement of the specific area 401 of the substrate 140.

By either pulsing the laser source 402A, or maintaining it on, as the substrate is moving in the X direction, the warpage along the length of the substrate 140 in the X-direction, over a very small portion in the Y direction, can be evaluated by the interface 190. Further, by locating a plurality of laser triangulation modules 400A in the Y direction, the overall warpage of the substrate 140 in the X and Y directions can be generally evaluated by the interface 190, using the Z direction data of each light receiving element 408A along the X direction length of the substrate 140 to map the substrate 140 surface.

FIG. 4B is an enlarged schematic cross-sectional view of a laser triangulation module 400B. The laser triangulation module 400B includes a laser source 402B, a transmitter lens 404, a light receiving lens 406, and a light receiving element 408B. In one embodiment, the laser source 402B is configured to deliver a line of light 410B to form an illumination line 412B on the substrate extending over a plurality of points 414B on a specific area 401 of the substrate 140 (shown in FIG. 1A) using a laser emission wavelength which does not expose, i.e., chemically alter, the photoresist on the substrate 140. The transmitter lens 404 allows the line of light 410B to be delivered to the plurality of points 414B forming the illumination line 412B. Each point reflects a portion 416B of the line of light 410B through the light receiving lens 406 to a point 418B of the light receiving element 408B corresponding to a z-axis position of a point of the plurality of points 414B on the specific area 401. Because the substrate 140 is continuously moving, by strobing the laser source 402B or maintaining the laser source 402B on, the line of light 410B is delivered to a plurality of locations of the substrate in the X direction to generate a 3D profile measurement of the substrate 140. Where the line width in the Y direction is less than the width of the substrate in the Y direction, a plurality of laser triangulation modules 400B are arranged in the Y direction to provide full coverage of the substrate in the Y direction.

In the embodiments hereon in FIGS. 4A and 4B, because the width of the substrate 140 in the X direction is substantially greater than the width of the digital lithography processing unit 164 in the Y direction and to expose the photoresist over the entire width of the substrate 140 in the Y direction, the above described scan and step system must be employed. The laser triangulation modules 400A, 400B are configured to cover the width in the Y direction that the digital lithography processing unit 164 can expose.

Figure 5:
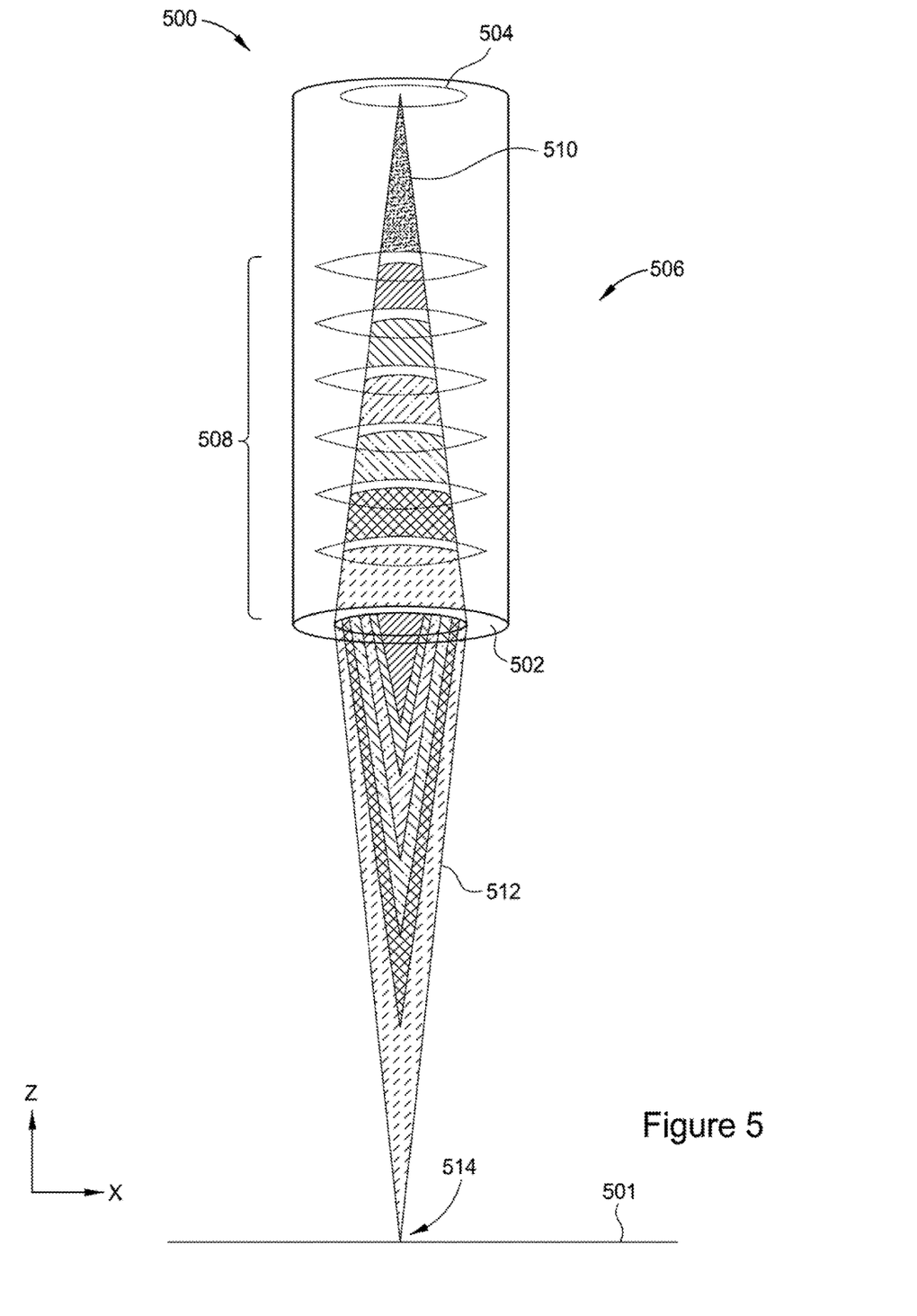
FIG. 5 is an enlarged schematic cross-sectional view of a color confocal module according to an embodiment.

FIG. 5 is an enlarged schematic cross-sectional view of a color confocal module 500. The color confocal module 500 includes a sensor 502, a light source 504, and an optical system 506. The optical system 506 includes a plurality of lenses 508 that divide light 510 delivered by the light source 504 into bands of light 512 of wavelengths that do not expose, i.e., chemically alter, the photoresist. The point 514 on the specific area 501 of the substrate 140, here a line of points in the X direction where the light impinges as the substrate moves in the X direction, reflects the bands of light 512 to the sensor 502, which information is transmitted to the interface 190 to allow it to determine a z-axis position of the point 514 on the specific area 501. The bands of light 512 are delivered to a plurality of points on the specific area 501 to generate a 3D profile measurement of the specific area 501 of the substrate 140, either by pulsing the light source 504 or maintaining light source 504 constantly on. Here, the specific area 501 can be a line along the length of the substrate 140 in the X direction. As with the embodiments of FIGS. 4A and 4B, by arranging a number of color confocal modules 500 in the Y direction, a number of linear specific areas 501 can be evaluated over the length of the substrate 140 in the X direction, and thereby allow the interface to map the warpage of the entire substrate 140 in the X and Y directions.

Figure 6:
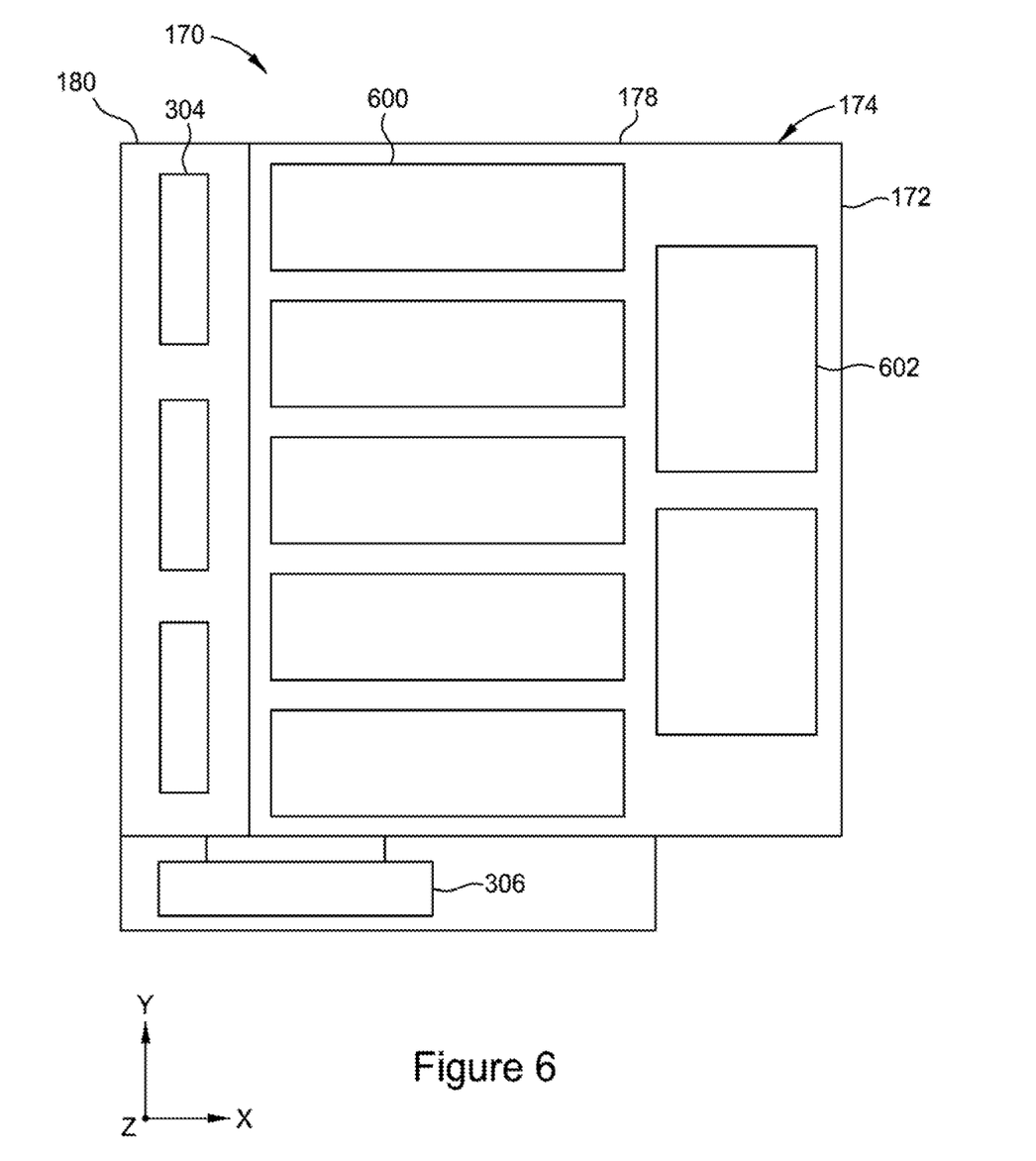
FIG. 6 is an enlarged schematic top view of an exemplary inspection system according to an embodiment.

FIG. 6 is an enlarged schematic top view of an additional exemplary inspection system 170. This inspection system 170 includes the inspection system support 172 and the inspection processing unit 174 that includes a warpage inspection tool 178 having one or more projectors 602 and one or more warpage inspection modules 600 configured to measure the 3D profile of specific areas of the substrate 140 (shown in FIG. 1A). The one or more projectors 602 are configured to project light, of a wavelength which does not expose, i.e., chemically alter, the photoresist, projected through or reflected from a fringe pattern (shown in FIG. 7) on specific areas of the substrate 140 (shown in FIG. 1A). The one or more warpage inspection modules 600 are configured to measure the 3D profile of specific areas of the substrate 140 by collecting beams of light reflecting off a plurality of points on the specific areas illuminated by the projected light. In one embodiment, the 3D profile of the specific area is provided to the interface 190, and used by the interface to modify the exposure pattern data supplied to the digital lithography processing unit 164 to compensate for warpage of the substrate 140 and prevent die-shift in the exposed pattern. In another embodiment, the one or more warpage inspection modules 600 are camera modules (shown in FIG. 7).

Figure 7:
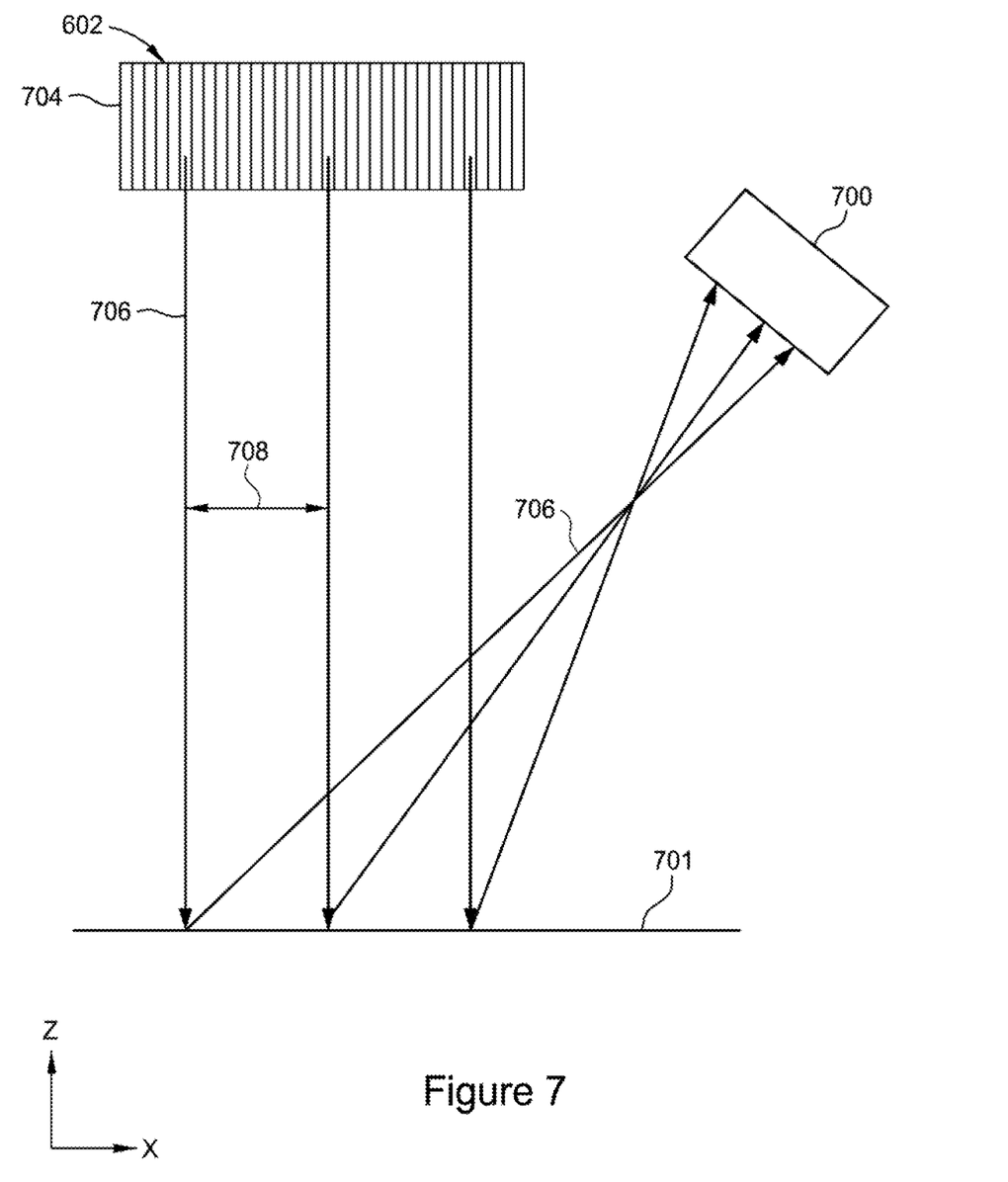
FIG. 7 is an enlarged schematic cross-sectional view of a projector and a camera of the exemplary inspection processing unit according to an embodiment.

FIG. 7 is an enlarged schematic cross-sectional view of a projector 602 and a camera module 700 of the exemplary inspection processing unit 174 (shown in FIG. 6). The projector 602 is configured to project a fringe pattern 704 on a specific area 701 of the substrate 140 (shown in FIG. 1A) without chemically changing the photoresist in the specific area 701. The fringe pattern 704 comprises beams of light 706 separated by a distance 708. In one embodiment, the distance 708 is less than about 0.5 millimeters (mm). The beams of light 706 are reflected off the specific area 701 of the substrate and an image is collected by the camera module 700. The camera module 700 provides the image, corresponding to a 3D profile measurement, to the interface 190, which changes the exposure pattern data supplied to the digital lithography processing unit 164 to correct for warpage.

In summation, dynamic imaging systems that compensate for pattern defects from distortion caused by warpage resulting in die-shift in the exposed resist are described herein. Measuring the 3D profile of specific areas, or all, of the substrate without chemically changing the photoresist in the specific areas, or all, of the substrate allows the specific areas, or all, of the substrate to be evaluating without exposing the resist. The integration of the inspection system with the digital lithography system in the dynamic imaging systems described herein allows for compensated exposure patterns to be formed in the photoresist which compensate for the distortion of the image caused by the warpage of the substrate. Additionally, the integration of the inspection system with the digital lithography system in the dynamic imaging systems also provides for decreased process time and increased throughput.

While the foregoing is directed to examples of the present disclosure, other and further examples of the disclosure may be devised without departing from the basic scope thereof, and the scope is determined by the claims that follow.

What is claimed is:

1. A method of creating compensated exposure patterns, comprising:
disposing a substrate on a stage of a dynamic imaging system, wherein the dynamic imaging system comprises:
a slab with the stage disposed thereover;
a digital lithography system disposed over the slab; and
an inspection system;
moving the stage under the inspection system to position a first area of the substrate under the inspection system;
measuring a three-dimensional (3D) profile of the first area of the substrate using the inspection system;
measuring a die-shift of at least one die in the first area of the substrate using the inspection system;
providing the 3D profile measurements and the die-shift measurements to an interface of the dynamic imaging system, wherein a distributor sequences the 3D profile measurements and the die-shift measurements;
determining a compensated pattern data for the first area of the substrate within the interface, wherein the compensated pattern data compensates for a warpage and the die shift on the substrate; and
exposing a portion of the first area of the substrate to a compensated pattern using the digital lithography system, wherein the compensated pattern is determined from the compensated pattern data.

2. The method of claim 1, wherein the measuring the 3D profile of the first area of the substrate and the measuring the die-shift of the at least one die of the first area of the substrate using the inspection system are repeated for successive areas of the substrate until 3D profile measurements and die-shift measurements along a length of the substrate have been taken.

3. The method of claim 2, wherein the exposing the portion of the first area of the substrate to the compensated pattern is performed subsequent to the measuring of the 3D profile of the successive areas of the substrate and the measuring of the die-shift of the successive areas of the substrate.

4. The method of claim 1, further comprising measuring a second 3D profile and a second die-shift of a second area of the substrate using the inspection system as the first area of the substrate is being exposed by the digital lithography system.

5. The method of claim 4, wherein the digital lithography system determines the completion of the exposing of the first area of the substrate.

6. The method of claim 1, wherein the compensated pattern data is sent to the digital lithography system.

7. The method of claim 1, wherein the 3D profile measurements are performed before the die-shift measurements.

8. The method of claim 1, wherein the interface overwrites an exposure pattern data with the compensated pattern data.

9. The method of claim 1, wherein the measuring the 3D profile is performed by a warpage inspection tool of the inspection system, the measuring the die-shift is performed by a die-shift inspection tool of the inspection system, the inspection system further comprises an opening beneath the inspection system for the stage to pass thereunder, and the digital lithography system further comprises a digital lithography system opening for the stage to pass thereunder.

10. The method of claim 9, wherein the warpage inspection tool further comprises one or more warpage inspection modules which each measure a 3D profile of the first area of the substrate and the die-shift inspection tool further comprises one or more die-shift inspection modules which each measure the die-shift of at least one die of the first area of the substrate without exposing a photoresist disposed on the first area.

11. A method of creating compensated exposure patterns, comprising:
  measuring a location of a substrate with a photoresist disposed thereon;
  moving an area of the substrate beneath an inspection system;
  measuring a 3D profile of the area of the substrate using a warpage inspection tool within the inspection system;
  measuring a die-shift of at least one die in the area of the substrate using a die-shift inspection tool within the inspection system;
  providing the location of the substrate to an interface;
  providing the 3D profile measurements to the interface;
  providing the die-shift measurements to the interface, wherein a distributor sequences the 3D profile measurements and the die-shift measurements;
  determining a compensated pattern data for the area of the substrate within the interface, which compensates for a warpage and the die shift on the substrate;
  sending the compensated pattern data to a digital lithography system as a compensated pattern; and
  exposing the photoresist on the substrate to the compensated pattern using the digital lithography system.

12. The method of claim 11, wherein the measuring of the location of the substrate is provided to the interface by an encoder.

13. The method of claim 11, wherein the interface overwrites an exposure pattern data with compensated pattern data.

14. The method of claim 11, wherein the 3D profile measurements comprise a difference in distance between an expected distance of the substrate from the inspection system and an actual distance of the substrate from the inspection system across discreet lengths and a full width of the substrate.

15. The method of claim 14, wherein die-shift measurements comprise a difference in expected coordinates of at least one die based on a global die-shift grid and actual coordinates of the at least one die.

16. A method of creating compensated exposure patterns, comprising:
  measuring a location of a first substrate with a first photoresist disposed thereon using a first encoder;
  moving an area of the first substrate beneath an inspection system;
  measuring a 3D profile of the area of the first substrate using a warpage inspection tool within the inspection system, wherein the warpage inspection tool comprises one or more laser triangulation modules;
  measuring a die-shift of at least one die in the area of the first substrate using a die-shift inspection tool within the inspection system without exposing the first photoresist, wherein the die-shift inspection tool comprises one or more automated optical inspection (AOI) modules;
  providing the location of the first substrate to an interface;
  providing the 3D profile measurements to the interface;
  providing the die-shift measurements to the interface, wherein a distributor sequences the 3D profile measurements and the die-shift measurements;
  determining a compensated pattern data for the area of the first substrate within the interface, which compensates for a warpage and the die shift on the first substrate; and
  exposing the first photoresist on the first substrate to a compensated pattern using a digital lithography system, wherein the compensated pattern is determined using the compensated pattern data.

17. The method of claim 16, further comprising a second substrate with a second photoresist disposed thereon, wherein
  a second encoder measures a location of the second substrate;
  the inspection system measures 3D profiles of areas of the second substrate;
  the die-shift inspection tool measures a die-shift of at least one die of a plurality of dies without exposing the photoresist disposed on the areas of the second substrate; and
  the inspection system provides the 3D profiles of the areas of the second substrate and the die-shift of at least one die to the interface, where at least one of warpage and die-shift is measured into the compensated pattern data and provided to the digital lithography system to expose the photoresist disposed on the areas of the second substrate in a digital lithography process with the compensated pattern.

* * * * *